June 24, 1969 J. F. BERES 3,452,282
AUTO RADIO VOLUME AND TONE CONTROL CIRCUIT
Filed May 3, 1965
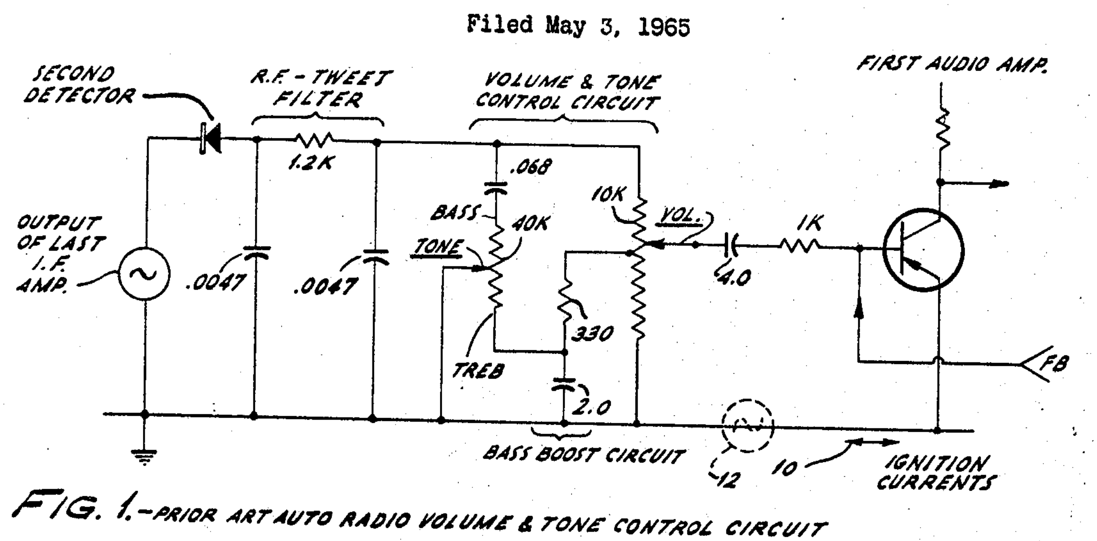
FIG. 1.—PRIOR ART AUTO RADIO VOLUME & TONE CONTROL CIRCUIT
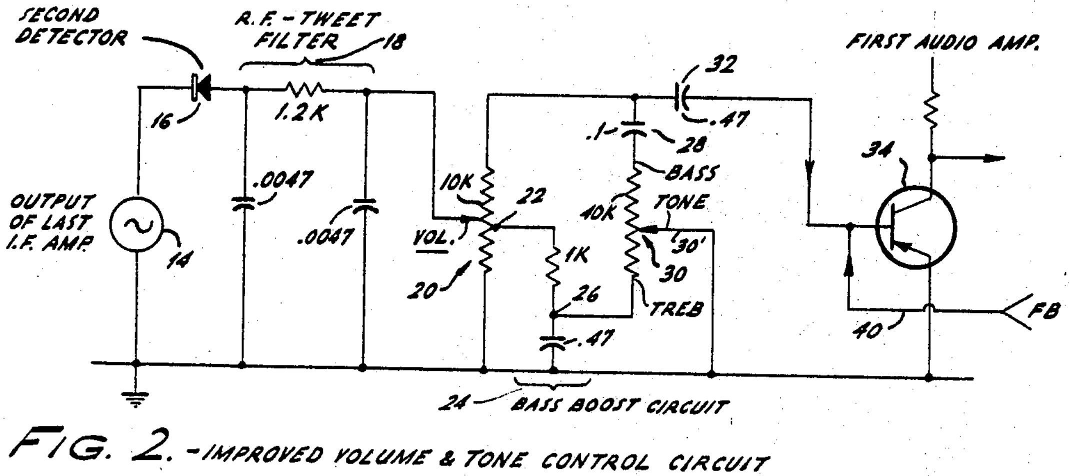
FIG. 2.—IMPROVED VOLUME & TONE CONTROL CIRCUIT
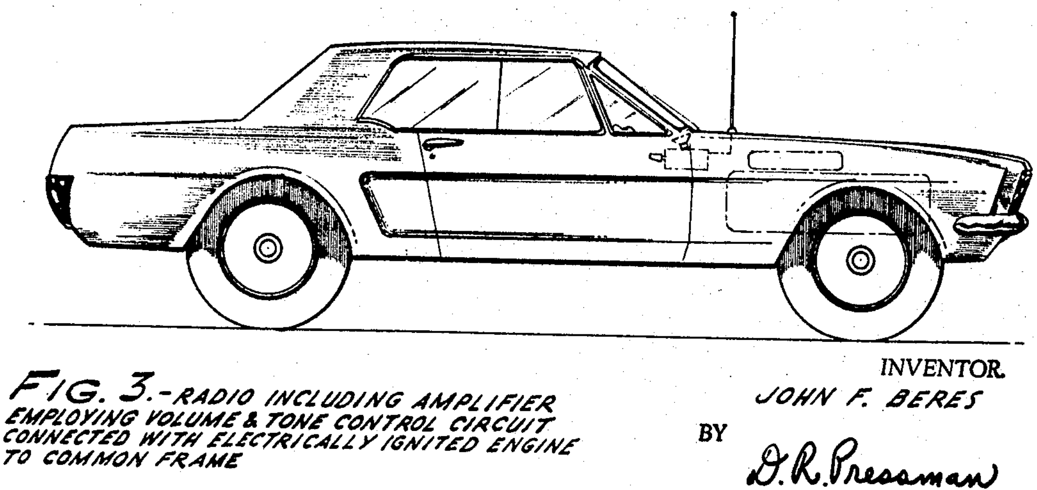
FIG. 3.—RADIO INCLUDING AMPLIFIER EMPLOYING VOLUME & TONE CONTROL CIRCUIT CONNECTED WITH ELECTRICALLY IGNITED ENGINE TO COMMON FRAME
INVENTOR.
JOHN F. BERES
BY D. R. Pressman
ATTORNEY United States Patent Office 3,452,282

Patented June 24, 1969

3,452,282
AUTO RADIO VOLUME AND TONE CONTROL CIRCUIT

John F. Beres, Southampton, Pa., assignor to Philco-Ford Corporation, a corporation of Delaware Filed May 3, 1965, Ser. No. 452,740
Int. Cl. H04b *1/16*
U.S. Cl. 325—424 6 Claims

ABSTRACT OF THE DISCLOSURE

A volume and tone control circuit for an auto radio receiver employing a reverse-connected volume control potentiometer, i.e., a potentiometer the variable tap terminal of which is its input terminal and a fixed terminal of which is its output terminal. The tone control and bass boost circuits are connected to the output side of the potentiometer. Because of the reverse connection, the volume control circuit has a higher output impedance, enabling: (1) the size of the DC-blocking capacitor at the input of the audio amplifier to be reduced, (2) the noise suppression resistor to the audio amplifier to be eliminated, (3) a higher impedance to be presented to the feedback circuit for the audio amplifier, and (4) ignition noise originating in the ground circuit near the input of audio amplifier to be suppressed.

This invention relates to volume and tone control circuitry, and more particularly to volume and tone control circuitry for amplifiers forming a part of a radio designed to be installed in a motor vehicle.

It is customary, in providing a volume control circuit for an electrical signal amplifier, to use an interstage network comprising a potentiometer, the resistance element of which is connected across the output of one stage. The input of the next stage is connected across the variable tap or "wiper" of the potentiometer and one terminal of the resistance element. It is also customary to connect the bass boost and tone control circuitry across the input of this volume control circuit.

It has been found that one disadvantage of this type of circuit, especially when used between the output of the second detector and the input of an audio amplifier in a radio receiver, is that the capacitors used must have a relatively large value to perform their assigned functions. This also applies to the decoupling capacitor required at the output of the volume control circuit. These large valued capacitors are necessitated because of the relatively low circuit impedances found in this type of circuit.

These low circuit impedances also create several other disadvantages. One such disadvantage occurs in transistor circuits wherein the stage following the volume and tone control circuit is a transistor amplifier whose input is arranged to receive a negative feedback signal. Such an amplifier has a variable input impedance according to the amount of negative feedback supplied thereto. When the volume control is set to a low position, there is very little fixed impedance provided between the tone control circuit and the transistor amplifier. A series resistor must be inserted between the output of the volume control potentiometer and the input of the transistor amplifier in order to prevent the variable impedance of the transistor amplifier from affecting the response of the tone control circuit. The drawbacks of this resistor include increased cost and volume and decreased reliability.

Another disadvantage of the low circuit impedances presented by the aforedescribed circuit is a reduction in the effectiveness of any feedback signal which is supplied to the input of the amplifying stage which follows the volume and tone control circuit. If the volume and tone control circuit has a low input impedance, feedback signals supplied to the input of the next amplifying stage will be excessively shunted through and dissipated in this low impedance.

A further and serious disadvantages of the aforedescribed volume control circuit is that at low volume settings stray currents in the ground circuit of the receiver are coupled to the input of the amplifier and produce noise signals at the output thereof. For instance, it has been found that in an auto radio, the ignition system creates high noise and pulse currents in the ground circuit of such a radio. This occurs because the ground connection of the radio is connected to the frame of the automobile, which is connected in common with the ignition system of the automobile's engine. Since the ground circuit has a finite resistance, these ignition currents create voltage drops in the ground circuit. When the volume control is at its low point, the input impedance to the succeeding amplifying stage from ground is low and ignition pulses resulting from such ignition currents are amplified and become audible.

OBJECTS

Accordingly several objects of the present invention are:

(1) to reduce the cost, volume, and number of components required for, and to increase the reliability of, an amplifying circuit which includes a volume control;

(2) to reduce the size of the capacitors required in a volume and tone control circuit;

(3) to eliminate the need for a series resistor at the input of a transistor amplifier which follows a volume and tone control circuit; and (4) to provide greatly increased noise immunity in a volume control circuit for an amplifier which is subject to spurious signals having a high noise or pulse content.

Other objects and advantages of the present invention will become apparent from a consideration of the ensuing description and the accompanying drawings.

SUMMARY

According to a preferred form of the present invention an interstage volume control potentiometer is connected so that its wiper and one end terminal of its resistance element are connected across the output of the preceding stage. Said one terminal and the other end terminal of the resistance element are connected to the input of the succeeding stage. The bass boost and tone control circuitry is connected to the output side of this potentiometer.

DRAWINGS

FIG. 1 shows a prior art volume and tone control circuit.

FIG. 2 shows a volume and tone control circuit according to the present invention.

FIG. 3 is a diagrammatic showing of a radio installed in an automobile which uses the frame thereof as the ground bus for the radio and the engine ignition system.

FIG. 1.—PRIOR ART CIRCUIT

FIG. 1 shows a prior art volume and tone control circuit of the type aforesdescribed. The volume and tone control circuit is connected between the second detector and its filter and the input of the first audio amplifying stage of a radio receiver designed to be used in a motor vehicle. It has been found that the volume and tone control part of the circuit of FIG. 1 requires the use of relatively large capacitors due to the low circuit impedances presented by the circuit and also requires the use of a series resistor at the transistor base connection which forms the input of the first audio amplifier to prevent the variable input impedance of the first audio amplifier from affecting the response of the tone control circuit. It has also been found that due to the low output impedance presented by the volume control circuit, feedback signals applied to the input of the first audio amplifier by way of feedback connection FB are partially dissipated in this low output impedance, especially when said volume control is set to a low-volume position. Further, and perhaps most seriously, the circuit of FIG. 1 is quite susceptible to noise effects due to ignition currents present in the ground lead when connected in common with a frame which also serves as part of the circuit of the engine ignition system. Particularly, ignition currents schematically indicated by double arrow 10 were found to flow in the ground lead which had the effect of creating voltage drops in said ground lead, such as indicated by the signal symbol 12. It has been found that when the volume control is at a low position, the low impedance between source 12 and the input of the first audio amplifying stage enables currents from source 12 to be picked up by the first amplifying stage and amplified by succeeding stages, thus creating undesirable noise sounds.

FIG. 2.—IMPROVED VOLUME AND TONE CONTROL CIRCUIT

*Description of circuit*

FIG. 2 shows a portion of an auto radio circuit arranged according to the present invention which eliminates or reduces significantly the undesirable features of the prior art circuit of FIG. 1.

In FIG. 2 the output of the last I.F. amplifier is represented by signal source 14. Source 14 may represent, for example, the secondary of a transformer whose primary is connected in the collector or plate circuit of the last I.F. amplifying stage. One terminal of source 14 is connected to ground or reference potential and the other terminal thereof is connected to one terminal of a second detector diode 16 which is arranged to rectify the output I.F. signal from source 14, thereby recovering the modulation envelope of said signal in well known manner. It will be appreciated that in lieu of diode 16, other forms of detectors, e.g., a transistor detector, may be used.

The other terminal of diode 16 is connected to a $\pi$-type low-pass RC filter 18 which consists of two shunt capacitors and one series resistor connected as shown. Filter 18 is designed to eliminate the radio frequency carrier and other undesirable radio frequency components present in the output signal from diode 16 which may cause tweets in the audio signal.

The output of filter 18 is connected to the wiper terminal of the potentiometer 20. Potentiometer 20 includes a resistance element having end terminals, the lower of which is connected to ground and the upper of which is connected to the input of the succeeding stage, as will be discussed. The resistance element of the potentiometer 20 may have a logarithmic taper so that the change in loudness at the output of the receiver will be approximately proportional to the amount of movement of the wiper contact. Potentiometer 20 also includes, in addition to the variable tap or wiper aforediscussed, a fixed tap 22 which is connected so that the resistance between tap 22 and the ground is about 45% of the value of the resistance element. In the specific circuit chosen for illustration in FIG. 2 the resistance from tap 22 to the grounded end of potentiometer 20 is approximately 4.5K ohms.

A bass boost circuit 24 consisting of a resistor and a capacitor connected in series is connected between fixed tap 22 and ground. A tone control circuit consisting of a capacitor 28 and a potentiometer 30 in series is connected so that one terminal of the capacitor 28 is connected to the upper end terminal of the resistance element of the potentiometer 20 while one terminal of potentiometer 30 which forms the other end of the series circut connected to the junction 26 of the resistor and capacitor in the bass boost circuit 24. The variable tap or wiper of potentiometer 30 is connected to ground.

One terminal of a DC decoupling capacitor 32 is also connected to the upper terminal of the resistance element potentiometer 20, and the other terminal of capacitor 32 is connected to the input of the succeeding audio amplifying stage 34. The amplifying element of the succeeding stage 34 is represented as a transistor; however it will be understood that a vacuum tube or any other type of amplifying device may be used in lieu thereof. A feedback signal may be applied to the input of stage 34 via lead 40. The audio amplifier may comprise that described in the co-pending joint application of the present inventor and H. L. Weil, Ser. No. 282,647, filed May 23, 1963, now Patent 3,260,946, granted Oct. 18, 1966. As discussed in said patent, the feedback signal on lead 40 may supply negative direct and alternating current feedback from the output stage of the audio amplifier. The potential on feedback lead 40 thereby biases the base elecerode of transistor 34.

*Operation of circuit*

The circuit of FIG. 2 operates in the following fashion. The audio signal developed from source 14 by detector 16 and filter 18 is applied across the wiper terminal and ground of potentiometer 20. Resistor 18 and the portion of potentiometer 20 between the wiper contact and ground form a divider network. With the wiper contact at its lowermost position no signal is supplied from filter 18 to the input of the audio amplifier stage. As the wiper is moved up from its lowermost position a larger fraction of the audio output signal of the second detector will be supplied to the input of the first audio amplifier stage. When the wiper of potentiometer 20 is positioned in the lower portion of the resistance element, bass boost circuit 24 will attenuate the treble response of the circuit, thereby effectively enhancing the bass response of the circuit at low volume levels in well known fashion.

The tone control circuit represented by potentiometer 30 and capacitor 28 is arranged to variably attenuate the treble response of the circuit. Tone control is achieved by shunting a portion of the audio signal to ground by way of capacitor 28 and resistor 30. As is well known, capacitor 28 has a lower impedance at treble frequencies than at bass frequencies. When the wiper of potentiometer 30 is in the upper part of the resistance element, the shunting impedance is determined largely by the impedance of capacitor 28 and a greater degree of treble attenuation will be produced, thereby effectively enhancing the bass response of the circuit. When wiper 30′ is in the lower portion of the resistance element the treble frequencies will be attenuated to a lesser degree. When the wiper 30′ is near or at the bottom of the resistance element there will be a very low impedance provided across the capacitor of bass boost circuit 24, thereby eliminating bass boost effect.

Capacitor 32 prevents direct current voltages present in the output of detector 16 from reaching the input of the first audio amplifying stage 34. It will be apparent that capacitor 32 may be inserted at any point in the connection between potentiometer 20 and the base of transistor 34 and the same decoupling effect will be provided.

Due to the higher source impedance for the audio amplifier stage created by the inverse connection of volume control potentiometer 20, the size of the bass boost capacitor and the decoupling capacitor 32 can be greatly reduced, thereby effecting savings of volume, cost, and increasing reliability of the circuit without sacrifice in performance. Also due to the higher output impedance presented by potentiometer 20 there is no need for the resistor which was found is series with the input of the first audio amplifier in the circuit of FIG. 1. That is, at high input signal levels, the wiper of potentiometer 20 will usually be set close to ground position by the listener, thereby providing a high source impedance for the tone control circuit so that the variable input impedance of the first audio amplifier will have little effect on the tone control circuit. The feedback signals provided at 40 will not be dissipated in a relatively low impedance as was the case with the circuit of FIG. 1, but will instead be used more efficiently in providing its feedback function.

Noise voltages caused by ignition currents in the ground connection will not be able to create audible effects in the circuit of FIG. 2 when the volume control is set at its lowest position (or in any other position) since in said lowest position the entire resistance of the potentiometer is interposed between ground and the input of the succeeding stage. Even when the wiper of the tone control potentiometer 30 is near its uppermost position the impedance of the tone control capacitor 28 is sufficient to minimize the effect of the ground circuit noise. It was found that the circuit of FIG. 2 provided substantially greater noise immunity than the circuit of FIG. 1 when installed in an automobile in which the frame served as the ground point for the radio and as a part of the electrical ignition system for the engine as shown in FIG. 3.

It will be understood that although the circuit of the invention provides great advantages when used in conjunction with an electrically ignited engine as discussed, the invention is not restricted to this application except as defined by the appended claims, inasmuch as the circuit provides significant other advantages besides that of noise immunity.

While there has been described what is at present considered to be the preferred embodiment of the invention it will be apparent that various modifications and other embodiments thereof will occur to those skilled in the art within the scope of the invention. Accordingly, it is desired that the scope of the invention be limited by the appended claims only.

I claim:

1. In a volume control circuit of the type comprising:

a source of a signal to be amplified, said source having two terminals, an amplifying stage having a common terminal and an input terminal for receiving said signal, means for supplying a direct current negative feedback signal to said input terminal and for biasing said input terminal, a direct current blocking capacitor having two electrodes, means for connecting one of said electrodes to said input terminal, and means for controlling the amplitude of said signal supplied to said stage comprising a volume control potentiometer having two end terminals and a variable tap terminal, one of said end terminals being connected to said common terminal of said stage and one of said two terminals of said signal source, the improvement wherein said variable tap terminal of said potentiometer is connected to the other of said two terminals of said signal source and the other of said end terminals of said potentiometer is connected to the other of said electrodes of said capacitor, whereby (1) the output impedance of said potentiometer will be increased so that the capacitance of said coupling capacitor may be reduced without degradation of performance and (2) the load on said means for supplying said feedback signal will be decreased.

2. The circuit of claim 1 further including a tone control circuit including at least one reactance connected between said other electrode of said capacitor and said common terminal of said stage.

3. The circuit of claim 2 wherein said tone control circuit comprises a tone control capacitor and a variable resistance connected in series relationship therewith.

4. The circuit of claim 3 wherein said variable resistance comprises a tone control potentiometer, the variable tap terminal of which is connected to said common terminal, said tone control circuit further including a bass boost capacitor and resistor connected to form a series path between a tap on the resistance element of said volume control potentiometer and said common terminal, the resistance element of said tone control potentiometer being connected between the junction of said bass boost capacitor with said bass boost resistor and one terminal of said tone control capacitor.

5. The circuit of claim 1 wherein said amplifying stage comprises a transistor and said input terminal of said stage is connected to the base electrode of said transistor.

6. In a radio receiver having active and reference power supply terminals and including:

an intermediate frequency amplifier arranged to supply an intermediate frequency signal between said reference terminal and a first terminal, a rectifying element comprising two electrodes, means for connecting one of said electrodes to said first terminal, a radio frequency filter including at least input, output, and common terminals and comprising at least a first capacitor and a first resistor, said input terminal being connected to the other of said electrodes of said rectifying element, said common terminal being connected to said reference terminal, a volume control potentiometer including a resistance element having a variable tap, a fixed tap, and first and second end terminals, said first end terminal being connected to said reference terminal, an audio amplifying stage having first and second input terminals, said first input terminal being connected to said reference terminal, an isolating capacitor having one electrode connected to said second input terminal of said amplifying stage and having another electrode, means for supplying a direct current negative feedback signal to said second input terminal of said amplifying stage and for biasing said second input terminal, a bass boost circuit comprising a second resistor and a second capacitor, each having first and second terminals, said first terminal of said second resistor being connected to said fixed tap on said resistance element of said volume control potentiometer, said first terminal of said second capacitor being connected to said reference terminal, said second terminals of said second resistor and said second capacitor being connected together to form a junction, and a tone control circuit including a third capacitor and another potentiometer, said third capacitor comprising two terminals, said other potentiometer comprising a resistance element having a variable tap and first and second end terminals, said variable tap of said other potentiometer being connected to said reference terminal, said first end terminal of said other potentiometer being connected to said junction of said second resistor and said second capacitor, said second end terminal of said other potentiometer being connected to one of said terminal of said third capacitor, the improvement wherein said second end terminal of said volume control potentiometer is connected to said other electrode of said isolating capacitor and said variable tap of said volume control potentiometer is connected to said output terminal of said radio frequency filter, and the other of said terminals of said third capacitor is also connected to said other electrode of said isolating capacitor, whereby (1) the capacitance of said isolating capacitor can be reduced without degradation of performance and (2) the load on said means for supplying a feedback signal is reduced.

References Cited

UNITED STATES PATENTS

| | | | |
|---|---|---|---|
| 2,074,852 | 3/1937 | Nelson | 325—424 XR |
| 2,847,519 | 8/1958 | Aronson | 330—29 XR |
| 2,995,621 | 8/1961 | Freedman et al. | 325—319 XR |
| 3,169,222 | 2/1965 | Krugman et al. | 325—319 |
| 3,349,331 | 10/1967 | Anthun | 325—424 |

KATHLEEN H. CLAFFY, *Primary Examiner.*

R. S. BELL, *Assistant Examiner.*

U.S. Cl. X.R.

179—1; 325—397; 330—29